(12) United States Patent
Wang

(10) Patent No.: US 8,629,514 B2
(45) Date of Patent: Jan. 14, 2014

(54) METHODS AND STRUCTURES FOR CUSTOMIZED STI STRUCTURES IN SEMICONDUCTOR DEVICES

(75) Inventor: Yimin Wang, Camas, WA (US)

(73) Assignee: Wafertech, LLC, Camas, WA (US)

( * ) Notice: Subject to any disclaimer, the term of this patent is extended or adjusted under 35 U.S.C. 154(b) by 138 days.

(21) Appl. No.: 13/008,252

(22) Filed: Jan. 18, 2011

(65) Prior Publication Data
US 2012/0181592 A1    Jul. 19, 2012

(51) Int. Cl.
*H01L 21/02*    (2006.01)
(52) U.S. Cl.
USPC .......................... 257/410; 438/275; 438/283
(58) Field of Classification Search
USPC .......................... 257/410; 438/275, 283, 294
See application file for complete search history.

(56) References Cited

U.S. PATENT DOCUMENTS

| | | | |
|---|---|---|---|
| 6,750,302 B1 * | 6/2004 | McDaniel et al. | 526/64 |
| 7,205,630 B2 * | 4/2007 | Chang et al. | 257/500 |
| 7,816,206 B2 * | 10/2010 | Ogura | 438/257 |
| 2006/0172504 A1 * | 8/2006 | Sinitsky et al. | 438/381 |

* cited by examiner

*Primary Examiner* — Howard Weiss
*Assistant Examiner* — Steven Rao
(74) *Attorney, Agent, or Firm* — Duane Morris LLP

(57) ABSTRACT

A method and structure provide for customizing STI, shallow trench isolation, structures in various parts of a system-on-chip, SOC, or other semiconductor integrated circuit device. Within an individual chip, STI structures are formed to include different dielectric thicknesses that are particularly advantageous for the particular device portion of the SOC chip in which the STI structure is formed.

20 Claims, 5 Drawing Sheets

METHODS AND STRUCTURES FOR CUSTOMIZED STI STRUCTURES IN SEMICONDUCTOR DEVICES

FIELD OF THE INVENTION

The present invention relates to semiconductor devices and manufacturing methods, more particularly to methods and structures for customizing STI (Shallow Trench Isolation) devices in System-On-Chip or other semiconductor devices.

BACKGROUND

System-On-Chip, SOC, devices are semiconductor devices in which a single integrated circuit chip includes various different device types in the chip. The SOC device may contain digital, analog, mixed-signal, and often radio-frequency functions all on a single chip, for example. In one particular example, a single chip may include a flash memory device portion, an SRAM device portion, a ROM device portion, digital logic circuitry, voltage pumps, voltage regulator devices, analog-to-digital converters, and so on. Each of the different device portions may be formed using different manufacturing operations and may require different operating characteristics.

One of the challenges in manufacturing various semiconductor devices and SOC devices in particular, is producing functionally different device portions such that their operational characteristics are compatible with one another. Low power SOC devices are devices that require low standby current. This condition must be met in all device portions. This operational characteristic would necessarily have to be compatible with each of the functional device portions of the SOC device since a high standby current in one of the device portions could adversely affect the operation of the entire SOC device.

Shallow Trench Isolation, STI, devices are used to electrically isolate active semiconductor structures from one another. This is true within and between the different device portions of an SOC device. For example, STI's may be used to isolate N-wells from P-wells. STI's may be used as such in any device portion, such as within an SRAM, Static Random Access Memory device. It has been found that STI edge junction leakage is one of the main sources of standby leakage. Low power SOC devices that require low standby current cannot operate with any significant level of standby leakage.

There is a tradeoff, however, between attempting to manufacture the various different device portions using common processing operations and minimizing the number of these processing operations, and delivering different operational characteristics to the different functional device portions as needed. For example, STI devices may be formed by forming trenches in a substrate and overfilling the trenches with an oxide or other dielectric material that is also formed over the surfaces of the substrate within which the trenches are formed. The oxide or other dielectric is then removed from over the substrate leaving the trenches filled with the dielectric. The STI structures may be formed to include a protrusion of the trench dielectric above the surrounding surfaces within which the trench is formed.

In SRAM devices, in particular in high density SRAM memory products, it is desirable to have STI structures that include such dielectric protrusions wherein the thickness of the dielectric protrusion is maximized in order to minimize standby current, thereby reducing standby current leakage and improving device performance. In flash memory devices, i.e. in the flash memory portion of an SOC device, in contrast, a split gate embedded flash process is commonly used and the split gate embedded flash process utilizes a double poly process, i.e. a process including multiple layers of polysilicon being deposited and patterned. The double poly process is inhibited, however, if the STI dielectric thickness is excessively thick, more particularly if the STI device includes a dielectric protrusion and the protrusion of the trench dielectric above the surrounding surface is great. A greater thickness of this dielectric protrusion creates greater steps that the polysilicon film traverses. This reduces the poly etch process window and may result in poly residue, such as polysilicon stringers formed along the edges of the STI structures where it is difficult to remove the polysilicon film using anisotropic polysilicon etching operations. The protrusion may even be tapered and include an overhang portion that may cover and obscure polysilicon material, making it more difficult to remove the polysilicon material in downwardly directed anisotropic etches. This poly residue often results in shorts or creates a leakage path between neighboring cells and induces flash cell failures.

Shallow Trench Isolation, STI, devices are conventionally formed by patterning and etching operations that create deep trenches etched into a semiconductor substrate, most typically a silicon substrate. The substrate upon which the SOC chips are being formed, is subjected to one sequence of patterning and etching operations commonly performed upon all areas of the substrate and all areas of the chip. The common sequence of patterning operations produces STI devices that are generally similar throughout the substrate and throughout the SOC device. The similar STI devices have similar dielectric thicknesses, i.e. if not completely coplanar with the substrate surface, the protrusions of the trench dielectric that extend above the surface generally have about the same height and same shape throughout an integrated circuit device, i.e. chip.

Regardless of the particular height or shape of any trench dielectric that may protrude above the surface, when all of the STI structures have about the same size and shape throughout the SOC device, any given height or shape will not be optimal in each of the different device portions. The STI may be the source of or contribute to problems in one or more of the different device portions since each device portion will have different optimum STI dielectric thicknesses and shapes.

The present invention addresses these concerns.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 5 shows customized STI structures formed in accordance with the invention.

DETAILED DESCRIPTION

One aspect of the present invention provides a tunable STI formation process in which STI structures formed on a substrate can be formed to different specifications, e.g. shapes and thicknesses. The invention finds particular advantage in system-on-chip, SOC, devices because SOC devices include different device portions that may require different operational characteristics. It should be understood, however, that aspects of the invention can be used for any semiconductor device in which differently shaped and sized STI structures within a chip, can be utilized.

One aspect of the invention is the formation of an oxide or other dielectric over a substrate surface and filling each of a plurality of trench openings formed in the substrate. Before forming STI devices from the dielectric material filling the trenches, selected portions of the SOC device are identified and the dielectric thickness reduced in those areas. When a subsequent etch back operation is used to remove the dielectric from areas other than the trench areas, STI devices are formed. The STI devices formed in different areas have different STI dielectric thicknesses. STI devices formed in areas where the dielectric thickness had been reduced prior to the etch back operation, include a lesser dielectric thickness than the STI devices formed in the other areas of the SOC device. At least the STI devices with the thicker dielectric include a dielectric portion that extends above the substrate surface.

Figure 1:
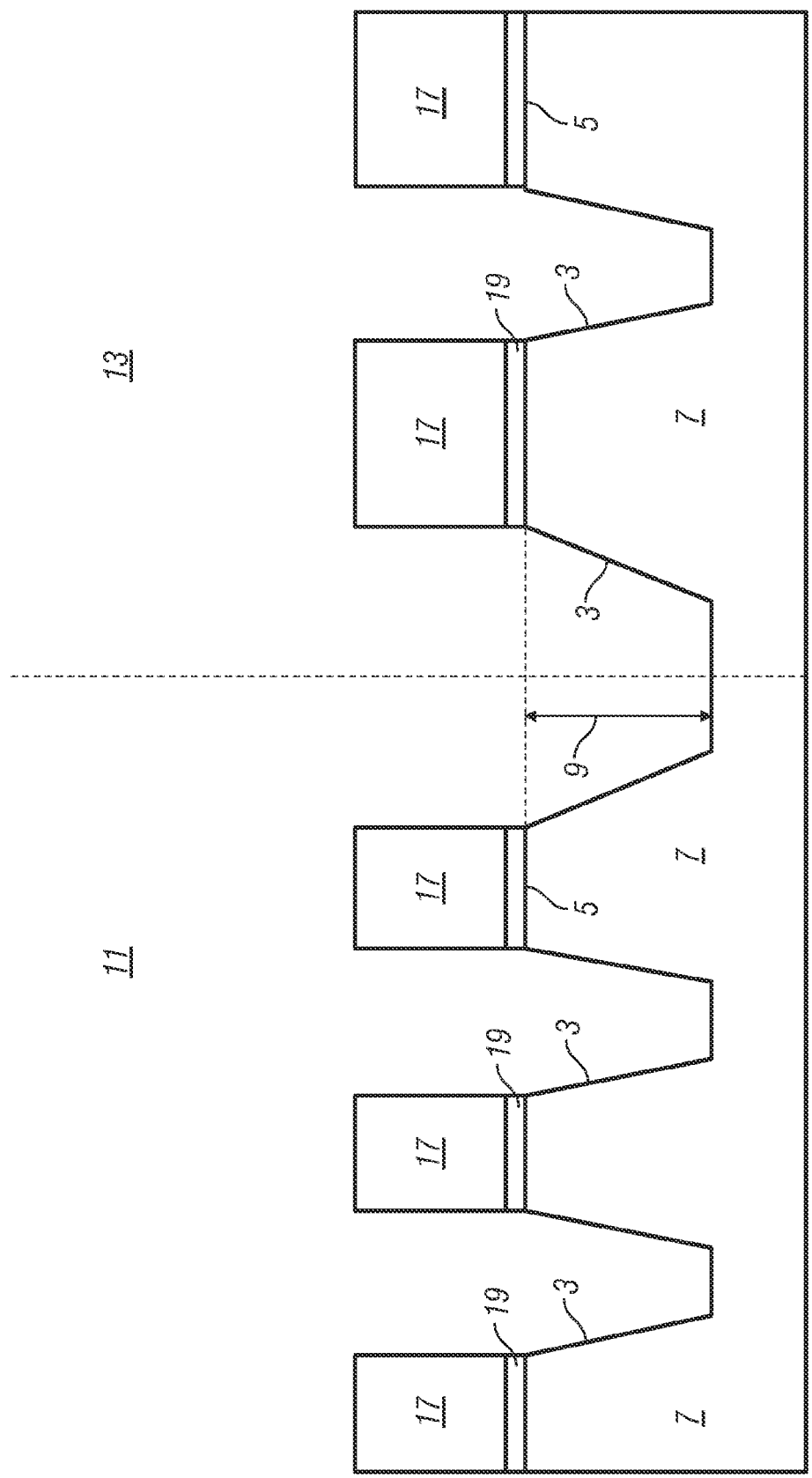
FIGS. 1-5 are cross-sectional views that illustrate a sequence of processing operations in accordance with the invention.

Now turning to the figures, FIG. 1 shows trenches 3 extending downwardly from upper surface 5 of substrate 7. Substrate 7 may advantageously be a silicon substrate but other semiconductor materials may be used as substrate 7. Trenches 3 are formed to substantially the same depth 9. More particularly, depth 9 is substantially the same in both first section 11 and second section 13.

First and second sections 11, 13 may represent two different device portions of an SOC device. Exemplary device portions include a flash memory device portion, an SRAM device portion, a ROM device portion, a digital logic circuitry portion, a voltage pump portion, a voltage regulator device portion, an analog-to-digital converter device portion and a digital-to-analog converter device portion but other device portions may be used in other exemplary embodiments. According to one exemplary embodiment, first portion 11 may be a high density SRAM device portion and second portion 13 may be a flash memory device portion, but these are intended to be exemplary only.

Trenches 3 may be formed using patterned hard mask layer 17 which may be any of various silicon nitride materials in one advantageous embodiment but other materials may be used for patterned hard mask layer 17 in other exemplary embodiments. According to one exemplary embodiment, thin oxide layer 19 may be formed on substrate surface 5. Thin oxide layer 19 may be a pad oxide or a buffer oxide and may include a thickness ranging from about 100-250 angstroms. Known processing operations may be used to form the films and to pattern patterned hard mask layer 17 and also to form trenches 3 extending downwardly into substrate 7.

Figure 2:
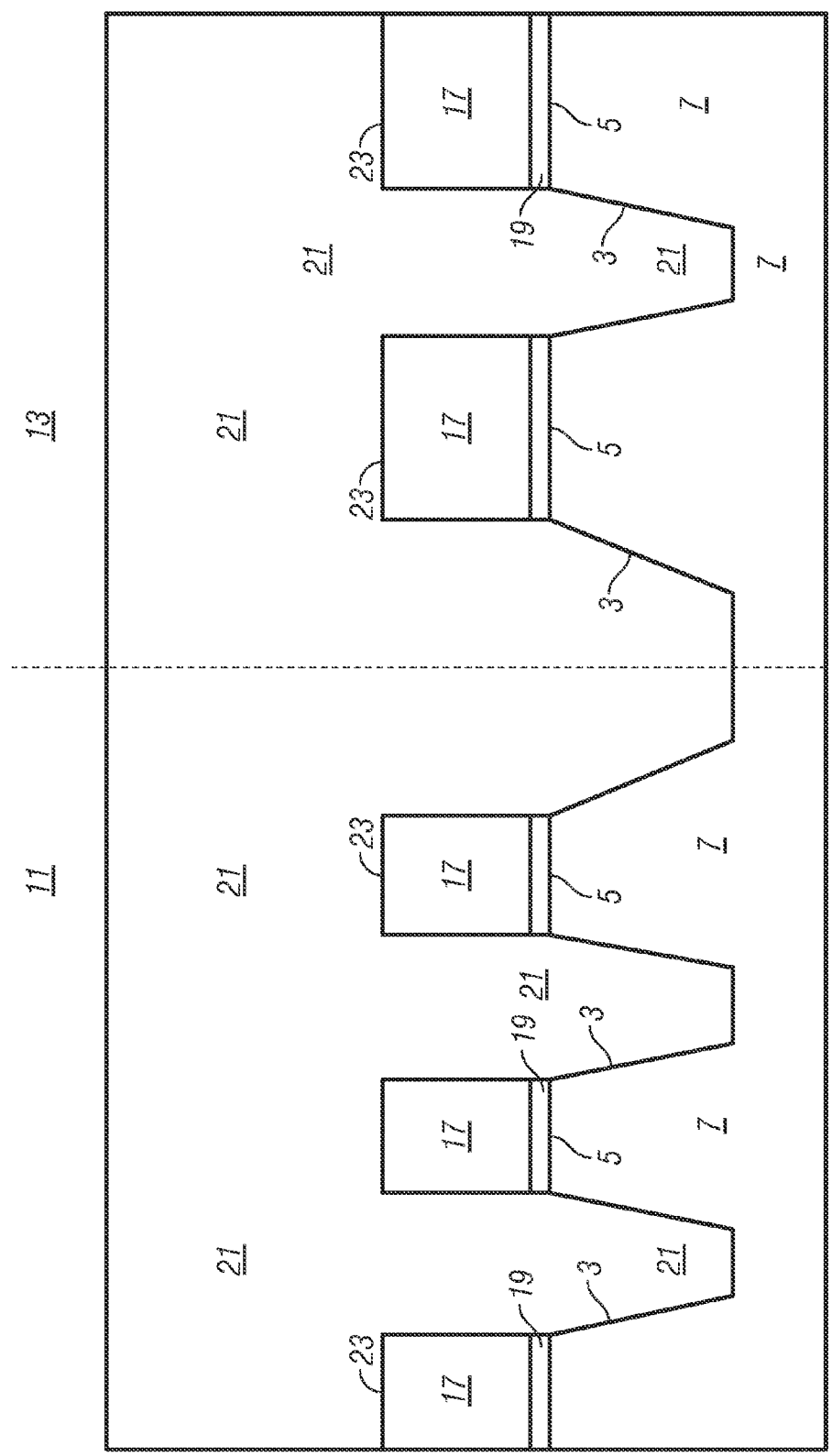

A dielectric layer is then formed over the structure in FIG. 1 to produce the structure shown in FIG. 2. Dielectric layer 21 fills each of trenches 3 and also extends over top surface 23 of patterned hard mask layer 17. Dielectric layer 21 may be an oxide in one exemplary embodiment but other suitable dielectric materials may be used in other exemplary embodiments. Various suitable deposition methods including but not limited to CVD, chemical vapor deposition and PVD, physical vapor deposition may be used to form dielectric layer 21. Dielectric layer 21 may be formed to various suitable thicknesses so long as dielectric layer 21 fills trenches 3 and covers patterned hard mask layer 17. Dielectric layer 21 includes upper surface 25 as deposited.

Figure 3:
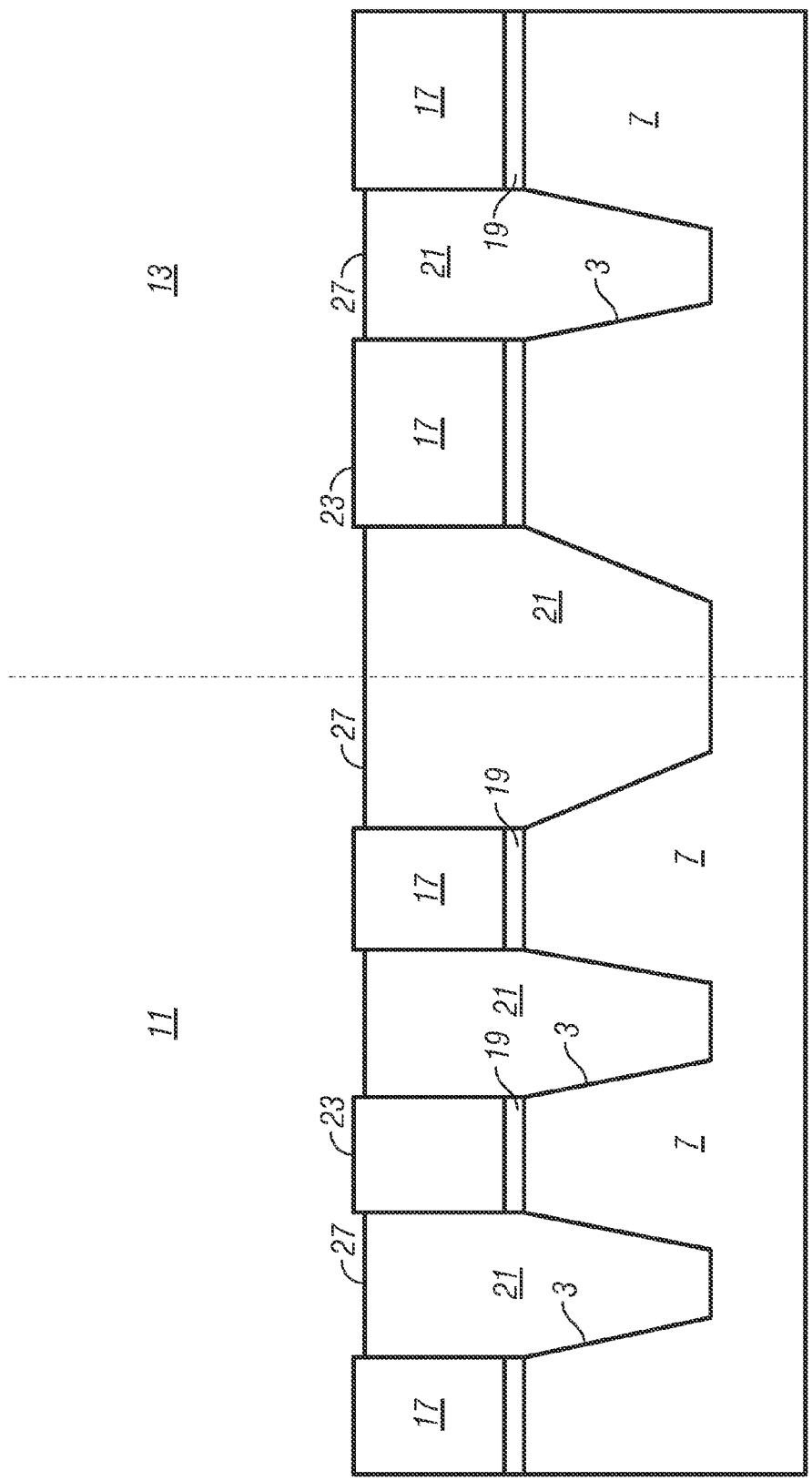

A polishing or other planarization technique is then carried out to produce the structure shown in FIG. 3. Conventional chemical mechanical polishing, CMP, operations or other planarization methods may be used to recede upper surface 25 and produce planarized surface 27 of dielectric layer 21 which may be substantially coplanar with top surface 23 of patterned hard mask layer 17 in one exemplary embodiment or planarized surface 27 may be slightly receded below top surface 23 of patterned hard mask layer 17 such as shown in FIG. 3, due to over-polishing. According to either embodiment, top surface 23 of patterned hard mask layer 17 is exposed in both first area 11 and second area 13.

Figure 4:
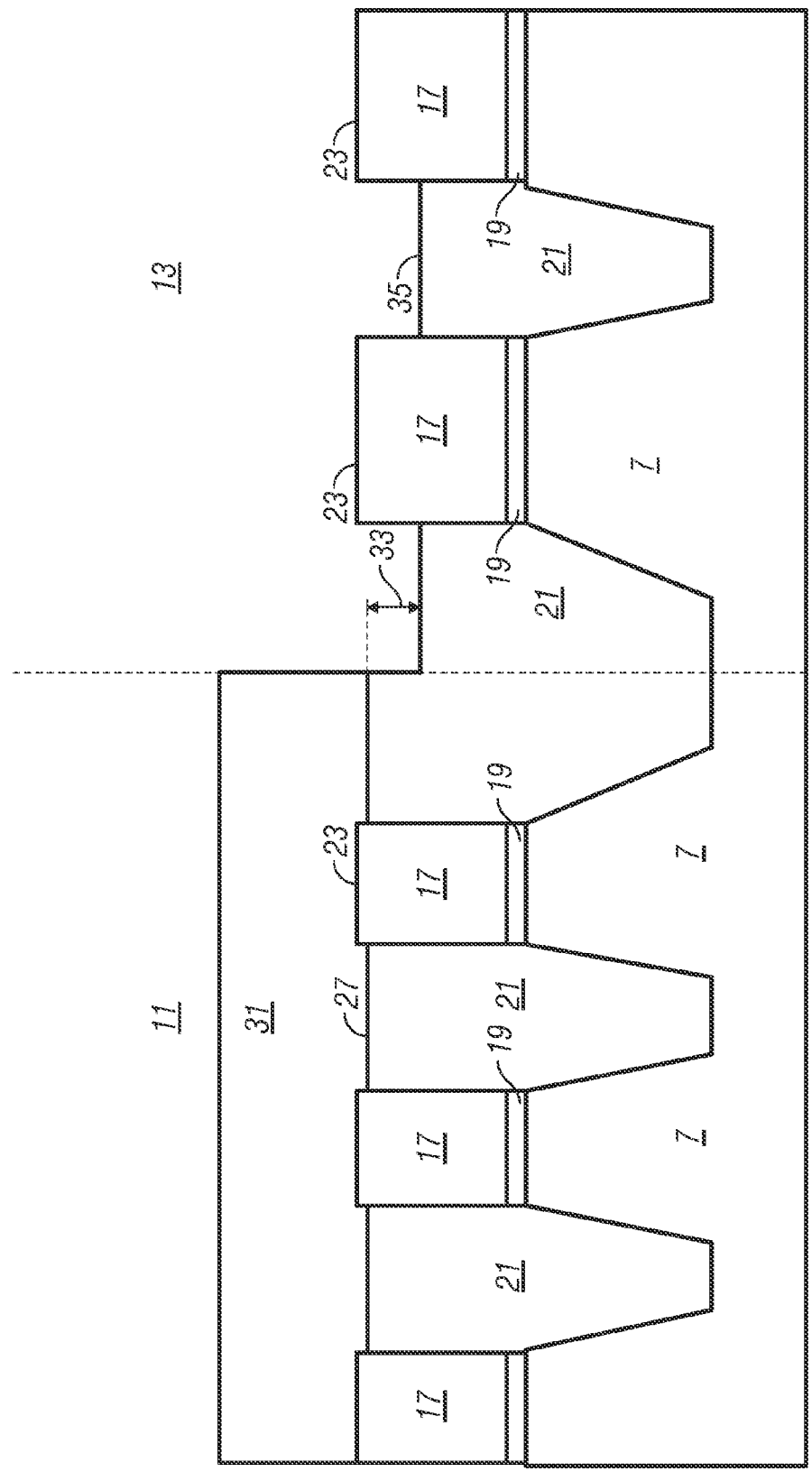

Patterned masking material 31 is formed over first portion 11 of the device as shown in FIG. 4. Patterned masking material 31 may be photoresist or any other suitable patterning material. After patterned masking material 31 is formed as shown in FIG. 4, an etching operation is used to downwardly recede the upper surface of dielectric layer 21 in second portion 13. According to one exemplary embodiment in which dielectric layer 21 is an oxide, an oxide dip such as in hydrofluoric acid, HF, may be used. Other wet dips or wet etches or dry etch operations may be used to recede the exposed upper surface of dielectric layer 21 in uncovered second portion 13 by depth 33 as in the illustrated embodiment. Receded upper surface 35 is receded below planarized surface 27 that remains in first area 11, by depth 33. Depth 33 may range from 50 to 500 angstroms in various exemplary embodiments, but other depths may be achieved in other exemplary embodiments.

After the etching or other operation is carried out to produce receded surface such as shown in FIG. 4, patterned masking material 31 is then removed.

According to yet another exemplary embodiment, not shown, after patterned masking material 31 is removed, a further patterning sequence may be carried out. Another patterned material may be formed over a portion of first area 11, second area 13 or over portions of both first area 11 and second area 13. A further etching operation is then used to etch a depth of the exposed portion of dielectric layer 21 to produce multiple areas of dielectric layer 21 having different thicknesses. According to one exemplary embodiment, in which the device being fabricated is an SOC device, the multiple areas having different dielectric layer thicknesses may represent different device portions such as the exemplary device portions listed supra. According to this exemplary embodiment, STI devices with different STI dielectric thicknesses will be formed in the different device portions, thereby customizing the device portions of the SOC device. When the processing operations used to produce STI structures from dielectric layer 21 are carried out, as described infra, the thickness of the STI dielectric in the final STI device structure will correspond to the dielectric layer thickness prior to the blanket etch operation used to form the STI devices, as further described infra.

After patterned masking material 31 is removed, an etching or other operation is used to remove patterned hard mask layer 17. According to one advantageous embodiment in which patterned hard mask layer 17 is silicon nitride, a conventional selective nitride wet etch operation may be used. After patterned hard mask layer 17 is removed, one or more dielectric etching operations may be used to remove a thickness of dielectric layer 21 in order to form STI structures in first and second portions 11 and 13, respectively. Various wet or dry dielectric etch operations may be used.

Figure 5:
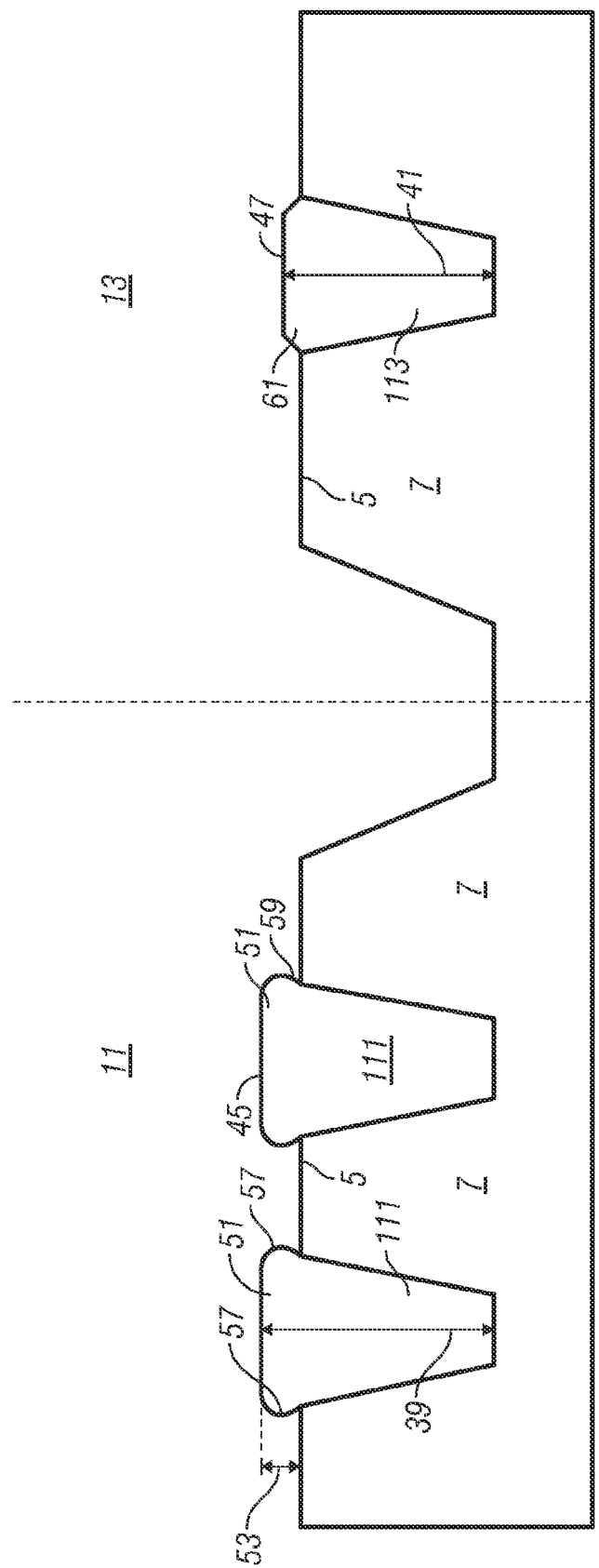

The dielectric material of dielectric layer 21 is removed from substrate areas other than trenches 3, i.e. dielectric material is removed from over substrate surface 5, thereby exposing substrate surface 5 as shown in FIG. 5. The dielectric etching operation is a blanket etching operation, i.e. no portion of the chip is patterned. The blanket dielectric etching operation is terminated such that each of the trenches 3 remains filled with dielectric 21 from dielectric layer 21, but dielectric layer 21 is removed from over other areas of substrate 7, i.e. substrate surface 5 is exposed. Because dielectric layer 21 had different thicknesses in different areas prior to the blanket etching operation, when the blanket etching operation is terminated such that all of the dielectric layer 21 and optional oxide layer 19 is removed from over substrate surface 5, there will be a greater thickness of dielectric remaining in trenches 3 in the areas corresponding to areas that had a greater thickness of dielectric layer 21 prior to the blanket etching operation. This results in the STI structures being formed to include different thicknesses.

For example, referring to FIG. 5, STI structures 111 formed in first area 11 include a greater STI dielectric thickness than STI structure 113 formed in second area 13. In the illustrated embodiment, both STI structures 111, 113 include top surfaces that extend above substrate surface 5, but, in other exemplary embodiments, STI structure 113 formed in second portion 13, may include a top surface substantially co-planar with substrate surface 5.

FIG. 5 shows that first STI structures 111 include a greater trench dielectric thickness 39 than thickness 41 of second STI structures 113 formed in second section 13. FIG. 5 shows that dielectric thickness 39 is the maximum thickness of first STI structure 111 and that thickness 41 is the maximum thickness of second STI structures 113. In the illustrated embodiment, the corresponding upper surfaces, top surfaces 45 of first STI structure 111 and top surface 47 of second STI structure 113, are both higher than substrate surface 5. According to one exemplary embodiment, thickness 39 of first STI structures 111 may be at least 250 angstroms greater than thickness 41 of second STI structures 113, but other differences in thickness may be achieved in other exemplary embodiments. Each of top surfaces 45 and 47 are generally flat with top surface 45 being somewhat convex in shape. According to other exemplary embodiments, either or both of top surfaces 45, 47 may be absolutely flat or they may each be more convex than as illustrated. In various exemplary embodiments, upper dielectric protrusion 51 of first STI structure 111 may include a height 53 of about 300 to about 600 angstroms in various exemplary embodiments. In some exemplary embodiments, the shape of first STI structure 111, in particular the shape of dielectric protrusion 51, may include an overhang portion such that sidewalls 57 taper outwardly upward from the intersection with substrate surface 5, resulting in fissures 59 at this location. In this exemplary embodiment, the top of dielectric protrusion 51 is wider than the width of dielectric protrusion 51 at substrate surface 5. In other exemplary embodiments, the shape of dielectric protrusion 51 may not include an overhang portion and may include substantially vertical sidewalls or dielectric protrusion 51 may include upper corners that are recessed inwardly. Second STI structures 113 include dielectric protrusion 61 that extends above substrate surface 5 in the illustrated embodiment, but as indicated previously, in other exemplary embodiments, top surface 47 may be substantially co-planar with substrate surface 5. Dielectric protrusion 61 of second STI structure 113 may include an overhang portion such as the overhang portion of dielectric protrusion 51 of first STI structure 111 or it may be recessed inwardly as illustrated in FIG. 5.

In other exemplary embodiments, there may be more than two different areas such as first area 11 and second area 13 that each contain STI structures with different thicknesses.

According to one aspect, the invention provides a semiconductor integrated circuit device. The semiconductor integrated circuit device which may be a system-on-chip, SOC, device, comprises a plurality of shallow trench isolation (STI) devices formed in a semiconductor substrate, each including a dielectric filling a trench extending downward from a substrate surface. The plurality of STI devices include first STI devices, each having a first dielectric thickness and a second STI devices, each having a second dielectric thickness being less than the first dielectric thickness. At least the first STI devices include the dielectric having a dielectric portion that extends above the substrate surface.

According to another aspect, a method is provided. A method for forming a SOC integrated circuit device comprises providing a semiconductor substrate with a substrate surface, forming a plurality of trenches extending downwardly from the substrate surface and into the semiconductor substrate, forming a dielectric layer that fills each of the trenches and covers the substrate surface and defining first and second areas within the SOC device. The method further provides for etching the dielectric layer only in the second area, the etched dielectric layer in the second area including a second area upper surface over the substrate surface. The method further comprises performing a blanket etching operation upon the dielectric to form an STI device in each trench, wherein the first STI devices are formed in the first portion and include a greater dielectric thickness than STI devices formed in the second portion.

According to yet another aspect, a method for forming a system-on-chip, SOC, integrated circuit device is provided. The method comprises providing a patterned nitride layer over an oxide layer disposed over a substrate surface of a semiconductor substrate, using the patterned nitride layer as a mask and etching a plurality of trenches into the semiconductor substrate, each of the trenches extending downwardly from the substrate surface, and depositing a dielectric layer filling the trenches and extending over the patterned nitride layer. The method further comprises receding an upper surface of the dielectric such that a receded dielectric upper surface is substantially co-planar with an upper surface of the patterned nitride layer. The method further comprises covering first portions of the SOC device with a patterned photoresist, removing a thickness of the dielectric from second portions of the SOC device not covered by patterned photoresist and removing the patterned nitride layer. The method further comprises performing a blanket etching operation upon the dielectric to remove the dielectric layer and the oxide layer from over the substrate surface and to form a shallow trench isolation device in each trench. The STI devices so formed include first STI devices in the first portion and second STI devices in the second portion, the first STI devices having a greater dielectric thickness than the second STI devices and at least the first STI devices including a first top surface higher than the substrate surface.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid in understanding the principles of the invention and the concepts contributed to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor integrated circuit device comprising:
   a plurality of shallow trench isolation (STI) devices formed in a semiconductor substrate, each said STI device including a dielectric filling a trench extending downward from a substrate surface and having opposed sidewalls that each extend to said substrate surface, said plurality of STI devices including:
   first STI devices, each having a first maximum dielectric thickness, and
   second STI devices, each having a second maximum dielectric thickness being less than said first maximum dielectric thickness,
   wherein at least said first STI devices include said dielectric having a first dielectric portion extending above said substrate surface.

2. The semiconductor integrated circuit device as in claim 1, wherein each said first STI device is disposed in a first portion of said integrated circuit device and each said second STI device is disposed in a second portion of said integrated circuit device.

3. The semiconductor integrated circuit device as in claim 2, wherein said integrated circuit device comprises a system-on-chip, SOC, integrated circuit device and further comprising third STI devices disposed in a third portion of said integrated circuit device and having a third maximum dielectric thickness being greater than said first maximum dielectric thickness.

4. The semiconductor integrated circuit device as in claim 1, wherein said second STI devices each include said dielectric having a second dielectric portion extending above said substrate surface.

5. The semiconductor integrated circuit device as in claim 4, wherein each of said first STI devices and said second STI devices include top surfaces that are one of substantially flat and convex in shape.

6. The semiconductor integrated circuit device as in claim 4, wherein said first dielectric portion includes a maximum width greater than a base width of said first dielectric portion at said substrate surface.

7. The semiconductor integrated circuit device as in claim 1, wherein said first maximum dielectric thickness is at least 250 angstroms greater than said second maximum dielectric thickness.

8. The semiconductor integrated circuit device as in claim 1, wherein said dielectric comprises an oxide.

9. The semiconductor integrated circuit device as in claim 1, wherein said integrated circuit device comprises a system-on-chip, SOC, integrated circuit device.

10. The semiconductor integrated circuit device as in claim 9, wherein each of said first STI devices is disposed in a first device portion of said SOC integrated circuit device and each of said second STI devices is disposed in a second device portion of said SOC integrated circuit device.

11. The semiconductor integrated circuit device as in claim 9, wherein said second STI devices are each disposed in a flash memory device portion of said SOC device and said first STI devices are each disposed in an SRAM (Static Random Access Memory) device portion of said SOC integrated circuit device.

12. The semiconductor integrated circuit device as in claim 11, wherein said flash memory device portion includes floating gate transistors and at least two levels of a polysilicon material.

13. A method for forming a system-on-chip (SOC) integrated circuit device comprising:
   providing a semiconductor substrate with a substrate surface;
   forming a plurality of trenches defined by opposed sidewalls extending downwardly from said substrate surface, into said semiconductor substrate;
   forming a dielectric layer that fills each of said trenches and covers said substrate surface;
   defining a first area and a second area within said SOC integrated circuit device and etching said dielectric layer only in said second area, said etched dielectric layer in said second area including a second area upper surface over said substrate surface;
   performing a blanket etching operation upon said dielectric layer to form a shallow trench isolation (STI) device in each said trench, wherein first STI devices are formed in said first portion and include a greater maximum dielectric thickness than second STI devices formed in said second portion.

14. The method as in claim 13, wherein:
   said forming a plurality of trenches comprises providing a patterned nitride layer over said substrate surface, using said patterned nitride layer as a mask and etching said plurality of trenches into said semiconductor substrate;
   said forming a dielectric layer includes depositing said dielectric layer over said patterned nitride layer,
   further comprising receding an upper surface of said dielectric layer to produce a receded dielectric surface that is substantially coplanar with an upper surface of said patterned nitride layer prior to said defining a first area and a second area and said etching said dielectric layer;
   said defining a first area and a second area within said SOC integrated circuit device and etching said dielectric layer comprise covering said first area with a masking material and removing a thickness of said dielectric from said second area, and
   further comprising removing said masking material and removing said patterned nitride layer prior to said performing a blanket etching operation.

15. The method as in claim 13, wherein said integrated circuit device comprises a system-on-chip (SOC) integrated circuit device, said first area comprises an SRAM (Static Random Access Memory) device portion and said second area comprises a flash memory device portion.

16. The method as in claim 13, wherein said dielectric comprises an oxide, each said trench is completely filled with said dielectric, at least said first STI devices include a dielectric portion that extends above said substrate surface and includes a top surface that is one of substantially flat and convex in shape.

17. The method as in claim 14, wherein said receding an upper surface comprises planarization;
said patterned nitride layer is disposed over a pad oxide layer;
said covering said first area with a masking material comprises forming a patterned photoresist material;
said performing a blanket etch operation includes removing said pad oxide layer; and
each of said first STI devices and said second STI devices have a top surface disposed higher than said substrate surface.

18. The method as in claim 14, further comprising after said removing a thickness of said dielectric from second area, covering a portion of said first area with a further masking material thereby defining a third area and etching to remove a second thickness of said dielectric from areas of said SOC integrated circuit device not covered by said further masking material; and
wherein said performing a blanket etching operation upon said dielectric layer further produces third STI devices in said third area, wherein said third STI devices include a greater maximum dielectric thickness than said first STI devices.

19. A method for forming a system-on-chip (SOC) integrated circuit device comprising:
providing a patterned nitride layer over an oxide layer disposed over a substrate surface of a semiconductor substrate;
using said patterned nitride layer as a mask and etching a plurality of trenches into said semiconductor substrate, each of said trenches defined by opposed sidewalls each extending downwardly from said substrate surface;
depositing a dielectric layer filling said trenches and extending over said patterned nitride layer;
receding an upper surface of said dielectric layer such that a receded dielectric upper surface is substantially co-planar with an upper surface of said patterned nitride layer;
covering first portions of said SOC device with a patterned photoresist;
removing a thickness of said dielectric from second portions of said SOC device;
removing said patterned nitride layer; and
performing a blanket etching operation upon said dielectric layer to remove said dielectric layer and said oxide layer from over said substrate surface and to form a shallow trench isolation (STI) device in each said trench including first STI devices in said first portions and second STI devices in said second portions,
said first STI devices having a greater maximum dielectric thickness than said second STI devices and at least said first STI devices including a first top surface higher than said substrate surface.

20. The method as in claim 19, wherein said first portions comprise an SRAM (Static Random Access Memory) device portion and said second portions comprise a flash memory device portion.

* * * * *